United States Patent [19]

Hawrylo et al.

[11] 4,355,396
[45] Oct. 19, 1982

[54] SEMICONDUCTOR LASER DIODE AND METHOD OF MAKING THE SAME

[75] Inventors: Frank Z. Hawrylo, Trenton; Gregory H. Olsen, Plainsboro, both of N.J.

[73] Assignee: RCA Corporation, New York, N.Y.

[21] Appl. No.: 96,975

[22] Filed: Nov. 23, 1979

[51] Int. Cl.$^3$ .......................... H01S 3/19; H01L 21/20
[52] U.S. Cl. .................................... 372/46; 148/171; 148/172; 148/175; 357/17; 29/569 L
[58] Field of Search .............. 331/94.5 H; 357/16–18; 148/171, 172, 174, 175; 29/569 L; 372/45, 46

[56] References Cited

U.S. PATENT DOCUMENTS

| | | | |
|---|---|---|---|
| 3,740,661 | 6/1973 | D'Asaro | 331/94.5 CH |
| 3,753,801 | 8/1973 | Lockwood et al. | 148/171 |
| 3,802,967 | 4/1974 | Ladany et al. | 148/171 |
| 3,920,491 | 11/1975 | Yonezu | 148/175 |
| 3,982,261 | 9/1976 | Antypas | 357/16 |
| 4,116,733 | 9/1978 | Olsen et al. | 148/175 |
| 4,122,410 | 10/1978 | Kressel et al. | 331/94.5 H |
| 4,149,175 | 4/1979 | Inoue et al. | 148/171 X |
| 4,188,244 | 2/1980 | Itoh et al. | 29/569 L |
| 4,233,090 | 11/1980 | Hawrylo et al. | 148/171 |
| 4,269,635 | 5/1981 | Logan et al. | 29/569 L |

FOREIGN PATENT DOCUMENTS

| | | | |
|---|---|---|---|
| 55-153383 | 11/1980 | Japan | 29/569 L |
| 55-153385 | 11/1980 | Japan | 29/569 L |

OTHER PUBLICATIONS

Yonezu et al., "GaAs-Al$_x$Ga$_{1-x}$As Double Heterostructure ...", Japanese J. Applied Physics, vol. 12, No. 10, Oct. 1973, pp. 1585–1592.
Ripper et al., "Stripe-Geometry Double Heterostructure ...", Applied Physics Letters, vol. 18, No. 4, Feb. 15, 1971, pp. 155–157.
Panish et al., "New Class of Diode Lasers", Scientific American, Jul. 1971, pp. 32–40.
Kirkby et al., "Photoelastic Waveguides and Their Effect on Stripe-Geometry GaAs/Ga$_{1-x}$Al$_x$As Lasers", J. App. Phys., vol. 50, No. 7, Jul. 1979, pp. 4567–4579.

*Primary Examiner*—James W. Davie
*Attorney, Agent, or Firm*—Birgit E. Morris; Donald S. Cohen

[57] ABSTRACT

A semiconductor laser diode includes a substrate of indium phosphide of one conductivity type having on a surface thereof an indium phosphide first confinement layer of the same conductivity type followed by an active layer of indium gallium arsenide phosphide and an indium phosphide second confinement layer of the opposite conductivity type. On the second confinement layer is an indium gallium arsenide phosphide capping layer of either conductivity type having a stripe shaped opening therethrough. In the opening in the capping layer is a contact layer of indium gallium arsenide phosphide of the opposite conductivity type. The confinement layers, the active layer and the capping layer are formed by liquid phase epitaxy and the contact layer is formed by vapor phase epitaxy.

9 Claims, 1 Drawing Figure

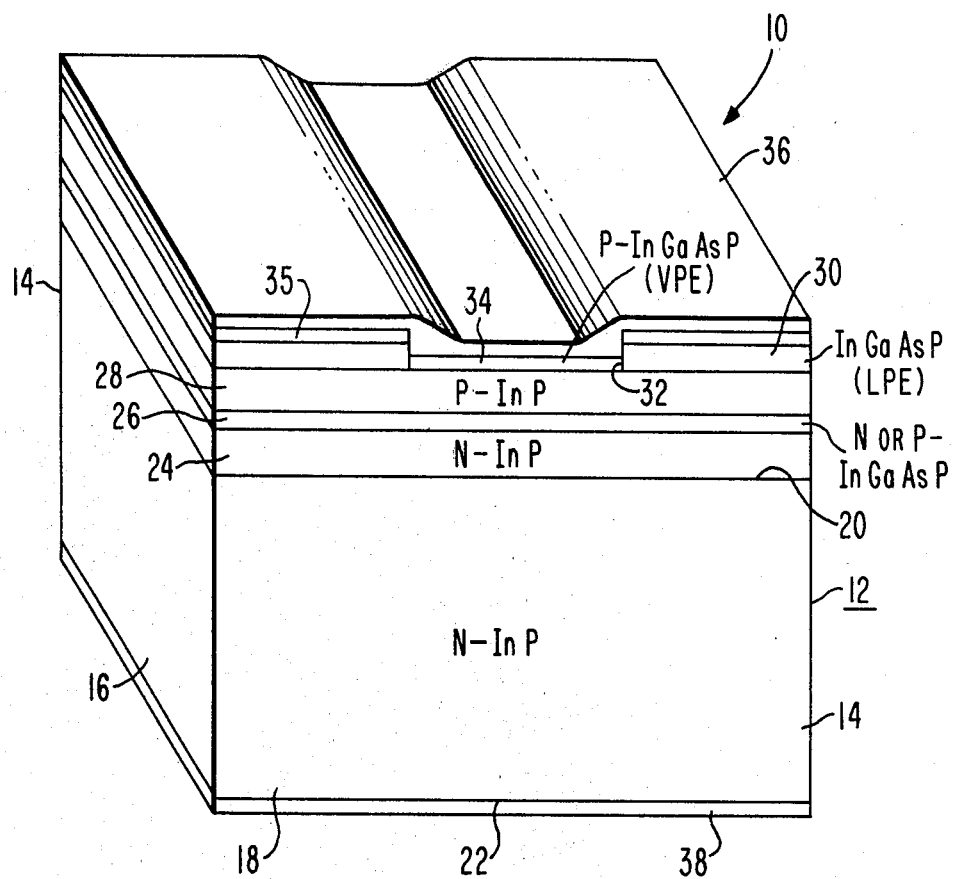

SEMICONDUCTOR LASER DIODE AND METHOD OF MAKING THE SAME

BACKGROUND OF THE INVENTION

The Government has rights in this invention pursuant to Contract No. NAS1-15440 awarded by the National Aeronautics and Space Agency.

The present invention relates to a semiconductor laser diode and method of making the same, and particularly to such a diode which will lase under continuous wave (CW) operation at room temperature.

Semiconductor laser diodes which will operate, i.e. lase, at room temperature generally include an active region between a pair of confinement regions. One of the confinement regions is of one conductivity type and the other is of the opposite conductivity type. The active region may be of either conductivity type. The confinement regions of each are a material having an index of refraction lower than the index of refraction of the material of the active region. Thus, the light that is generated in the active region is confined in the active region by the confinement regions so as to achieve lasing. Lasing is also enhanced by confining the generation of light to the portion of the active region which is spaced from the side surfaces of the diode. One technique of accomplishing this is to form one contact in the form of a stripe so that the flow of electrons across the active region is spaced from the side surfaces of the diode.

The semiconductor laser diodes are generally formed by epitaxially depositing a plurality of layers of the semiconductor material in succession on a substrate with the layers forming the confinement and active regions of the diode. The two techniques which are generally used to epitaxially deposit semiconductor material are vapor phase epitaxy (VPE) and liquid phase epitaxy (LPE). In vapor phase epitaxy the substrate is exposed to a gaseous mixture which contains the elements of the semiconductor material to be deposited. The gas is heated to a temperature at which it reacts to form the semiconductor material which deposits on the substrate. In liquid phase epitaxy the substrate is brought into contact with a heated solution of the semiconductor material in a solvent. The solution is cooled to precipitate out the semiconductor material which deposits on the surface of the substrate. Each of these techniques has advantages and disadvantages with respect to the other. However, a major advantage that liquid phase epitaxy has is that it is easy to carry out in much simpler and less expensive equipment than is necessary for vapor phase epitaxy. Thus, semiconductor laser diodes made by liquid phase epitaxy are less expensive to manufacture.

The wavelength of the light emitted by a semiconductor laser diode depends on the particular material used to make the diode. One system of materials which has been used to successfully make laser diodes which will operate CW at room temperature by the technique of liquid phase epitaxy is a gallium arsenide-aluminum gallium arsenide system. This system of materials provides a laser diode which generates light in the wavelength range of 0.7 to 0.9 micrometers. However, for certain types of optical communication systems it is desirable to have a laser diode which emits light at wavelengths greater than 0.95 micrometers. One system of materials which will generate light at this wavelength is indium phosphide and alloys of indium phosphide, such as indium gallium arsenide phosphide. Although laser diodes made with this system of materials by liquid phase epitaxy have been successfully operated by pulse operation, such devices which will operate at CW without excessive heating have been difficult to make using liquid phase epitaxy.

SUMMARY OF THE INVENTION

A semiconductor laser diode includes a body having an active layer between confinement layers of opposite conductivity type. A capping layer is over one of the confinement layers and has a stripe-like opening therethrough. A contact layer is in the opening in the capping layer and contacts the one confinement layer. The capping layer and the contact layer are of the same material and conductivity type, with the capping layer being formed by liquid phase epitaxy and the contact layer being formed by vapor phase epitaxy.

BRIEF DESCRIPTION OF THE DRAWING

The FIGURE of the drawing is a perspective view of a form of a semiconductor laser diode incorporating the present invention.

DETAILED DESCRIPTION OF THE INVENTION

Referring to the drawing, a semiconductor laser diode embodying the present invention is generally designated as 10. The laser diode 10 includes a body 12 of a single crystalline semiconductor material. The body 12 is in the form of a rectangular parallelepiped having a pair of spaced, opposed end surfaces 14 and a pair of spaced, opposed side surfaces 16 extending between the end surfaces 14. The end surfaces 14 are reflective of light, with at least one of the end surfaces 14 being at least partially transparent to light.

The body 12 includes a substrate 18 having parallel top and bottom surfaces 20 and 22 extending between the end surfaces 14 and the side surfaces 16. On the top surface 20 of the substrate 18 are superimposed epitaxial layers 24, 26 and 28. The epitaxial layer 24 which is directly on the substrate surface 20 is a first confinement region. The epitaxial layer 26 which is on the confinement region 24 is the active region of the laser 10. The epitaxial layer 28 which is on the active region 26 is the second confinement region of the laser 10. The first and second confinement regions 24 and 28 are of opposite conductivity type. For example, as shown, the first confinement region 24 is of N type conductivity and the second confinement region 28 is of P type conductivity. The active region 26 may be of either conductivity type. The confinement regions 24 and 28 are of a semiconductor material having an index of refraction lower than the index of refraction of the material of the active region. To obtain a laser 10 which will emit light in the wavelength range above 0.95 micrometers, the confinement regions 24 and 26 may be of indium phosphide (InP) and the active region 28 may be of indium gallium arsenide phosphide (InGaAsP). The substrate 18 is of the same conductivity type as the first confinement region 24 and of a semiconductor material which readily promotes the epitaxial growth of the first confinement region 24 thereon. Preferably, the substrate 18 is of the same semiconductor material, indium phosphide, as the first confinement region 24.

On the second confinement region 28 is a capping layer 30. The capping layer 30 has an opening 32 therethrough in the shape of a stripe which extends between the end surfaces 14 of the body 12 but is spaced from the side surfaces 16. Within the opening 32 and on the surface of the second confinement region 28 is a contact layer 34. The capping layer 30 and contact layer 34 are of the same semiconductor material. The contact layer 34 is of P type conductivity indium gallium arsenide phosphide, whereas the capping layer 32 may be of either P type or N type indium gallium arsenide phosphide. However, the capping layer 30 is an epitaxial layer deposited by liquid phase epitaxy whereas the contact layer 34 is an epitaxial layer deposited by vapor phase epitaxy.

On the capping layer 30 is a layer 35 of an insulating material, such as silicon dioxide. On the insulating layer 35 and the contact layer 34 is a conductive layer 36 of a material which adheres well to the insulating layer 35 and contact layer 34 and makes good ohmic contact with the contact layer 34. For example, the conductive layer 36 may be a gold coated nickel film directly on the contact layer 34. This is coated with a trimetal of chromium, platinum and gold which also extends over the insulating layer 35. A conductive layer 38 is on the bottom surface 22 of the substrate 18. The conductive film 38 is of a material which adheres well to and makes good ohmic contact with the material of the substrate 18. For example, the conductive layer 38 may be a multi-film layer which includes a film of tin directly on the bottom surface 22 of the substrate, a nickel film over the tin film and a gold film over the nickel film.

To make the semiconductor laser device 10, the first confinement region 24, active region 26, second confinement region 28 and capping layer 30 are deposited in succession on the top surface 20 of the substrate 18 by liquid phase epitaxy. This may be done using the deposition apparatus and method shown and described in U.S. Pat. No. 3,753,801 to H. F. Lockwood et al entitled "METHOD OF DEPOSITING EPITAXIAL SEMICONDUCTOR LAYERS FROM THE LIQUID PHASE" issued Aug. 21, 1973. In general, this apparatus includes a furnace boat having a plurality of spaced wells therein, one for each epitaxial layer to be deposited, and a slide movable longitudinally through the boat and across the bottom of each of the wells. The slide contains a recess in its surface which is adapted to carry the substrate 18 into each well in succession. In each of the wells is a charge of the semiconductor material to be deposited, a solvent for the semiconductor material and a conductivity modifier, if one is to be used. The apparatus may include one or more source wafers for achieving exact saturation of the solution in each of the wells. The source wafer may be mounted in a recess in the slide in front of the substrate or a separate source wafer may be placed in each well over the solution.

To make the semiconductor laser diode 10, the first well may contain indium phosphide as the semiconductor material, indium as the solvent and either tin, germanium, tellurium or sulfur as the N type conductivity modifier. The second well may contain indium phosphide, gallium arsenide and indium arsenide as the semiconductor material, and indium or gallium as the solvent. This well may contain either an N type or a P type conductivity modifier although it is preferable to include no conductivity modifier. The third well may include indium phosphide as the semiconductor material, indium as the solvent and either zinc, cadmium, magnesium or beryllium as a P type conductivity modifier. The fourth well may include indium phosphide, gallium arsenide and indium arsenide as the semiconductor material, either indium or gallium as the solvent and either zinc, cadmium, magnesium or beryllium as the P type conductivity modifier.

The furnace boat with the charges and the substrate therein is placed in a furnace tube and a flow of high purity hydrogen is provided through the furnace tube and over the furnace boat. The furnace tube is heated to heat the contents of the furnace boat to a temperature at which the solvent is molten, and the semiconductor materials and conductivity modifiers dissolve in the molten solvent, between about 570° C. and 750° C. This temperature is maintained long enough to insure complete melting and homogenization of the ingredients of the charges. The slide is then moved to bring the substrate 18 into each of the wells in succession. While the substrate is in a well and in contact with the solution therein, the furnace is cooled to cool the furnace boat and its contents. This causes some of the semiconductor material in the solution to precipitate out and deposit as an epitaxial layer on the substrate. As the semiconductor material deposits some of the conductivity modifier becomes incorporated in the semiconductor material to provide the deposited layer with the desired conductivity type. Thus, the N type indium phosphide first confinement region 24 is deposited on the substrate 18 first, followed in succession by the indium gallium arsenide phosphide active region 26, the P type indium phosphide second confinement region 28 and finally the P type indium gallium arsenide phosphide capping layer 30. The substrate 18 with the layers thereon is then removed from the furnace boat.

The silicon dioxide layer 35 is then deposited on the capping layer 30 by thermally decomposing silane in oxygen to form silicon dioxide which deposits on the capping layer 30. To form the opening 32 in the capping layer 30 a resist layer is applied to the silicon dioxide layer 35 except over where the opening 32 is to be formed using standard photolithographic techniques. The exposed area of the silicon dioxide layer 35 is removed with a suitable etchant, such as by hydrofluoric acid, to expose a portion of the capping layer 30. The exposed area of the capping layer 30 is then removed using a suitable etchant, such as either nitric acid or an aqueous solution of nitric acid, acetic acid and hydrofluoric acid to form the opening 32. The contact layer 34 is then deposited in the opening 32 using vapor phase epitaxy. This may be achieved using the method and apparatus described in U.S. Pat. No. 4,116,732 to G. H. Olsen et al, entitled "VAPOR PHASE GROWTH TECHNIQUE OF III-V COMPOUNDS UTILIZING A PREHEATING STEP", issued Sept. 26, 1978. In this method a gaseous mixture containing gallium arsenic indium and phosphorus is provided within a reaction tube which contains the substrate 18 with the various layers thereon. The gallium and indium may be provided by passing hydrogen chloride over sources of gallium and indium respectively. The arsenic may be provided by flowing arsine into the reaction tube and the phosphorus by flowing phosphine into the reaction tube. The P type conductivity modifier may be obtained by flowing vapors containing zinc, cadmium, magnesium or beryllium into the tube. The gaseous mixture is heated to a temperature about 700° C., at which it reacts to form P type indium gallium arsenide phosphide which deposits on the exposed surface of the confinement region 28 at the opening 32 in the capping layer 30. Some of the materials may also deposit on the capping layer 30. The conductive layers 36 and 38 may be applied by depositing the various features thereof in succession by the well known technique of evaporation in a vacuum.

The semiconductor laser diode 10 of the present invention has the advantage over a semiconductor laser diode of similar construction but made entirely by liquid phase epitaxy techniques in that it will lase when operated at CW and room temperature. A semiconductor laser diode of similar construction but having a liquid phase epitaxy capping layer which extended completely over the second confinement layer so that the capping layer acted also as a contact layer failed to lase when operated at CW and room temperature. However, when a stripe-like portion of the liquid phase epitaxy capping layer was replaced with the vapor phase epitaxy contact layer 34 in accordance with the present invention, the laser diode surprisingly lased when operated at CW and room temperature.

Although the reasons why the semiconductor laser diode 10 of the present invention does so lase are not fully understood, it is believed that one factor is that by using vapor phase epitaxy the acceptor concentration in the contact layer 34 is higher than can be achieved with a liquid phase epitaxy layer so as to reduce the ohmic resistance of the contact which reduces detrimental heating effects in the laser diode 10. When using liquid phase epitaxy to achieve a higher acceptor concentration the tendency is for the acceptors to diffuse through the active region 26 into the first confinement region 24, thereby displacing the P-N junction away from the laser active region. Another factor may be that by providing a lateral discontinuity in the capping layer there is a lessening of the current spreading across the laser 10, resulting in a better current confining path and improved heat dissipation. Other possible factors include relief of lattice mismatch strain due to a difference in composition of the vapor epitaxy layer and improved laser waveguiding due to a refractive index profile tailored by the applied stress of the vapor phase epitaxy layer.

We claim:

1. In a semiconductor laser diode which includes
    a body of semiconductor material including an active layer between confinement layers of opposite conductivity type,
    a capping layer over one of said confinement layers, said capping layer having a stripe-like opening therethrough, and
    a contact layer in said opening in said capping layer and contacting the one confinement layer, the improvement comprising
    said capping layer and said contact layer being of the same material, the capping layer being a liquid phase epitaxy layer, the contact layer being a vapor phase epitaxy layer.

2. A semiconductor laser diode in accordance with claim 1 in which the confinement layers and active layer are liquid phase epitaxy.

3. A semiconductor laser diode in accordance with claim 2 in which the confinement layers are of indium phosphide, and the active layer, capping layer and contact layer are of indium gallium arsenide phosphide.

4. A semiconductor laser diode in accordance with claim 3 in which the body includes a substrate of indium phosphide supporting the layers with the other confinement layer being directly on one surface of the substrate.

5. A semiconductor laser diode in accordance with claim 4 in which the substrate and the other confinement layer are of N type conductivity and the one confinement layer, and contact layer are of P type conductivity and the capping layer is of either conductivity type.

6. A semiconductor laser diode in accordance with claim 5 including a separate conductive layer over the contact layer and over a surface of the substrate opposite the one surface.

7. A method of making a semiconductor laser diode comprising the steps of:
    depositing in succession on the surface of a substrate by liquid phase epitaxy a first confinement layer, an active layer, a second confinement layer and a capping layer,
    providing a stripe shaped opening through the capping layer to the second confinement layer, and then
    depositing on the exposed surface of the second confinement layer in the opening a contact layer by vapor phase epitaxy, said capping layer and said contact layer being of the same composition has been inserted.

8. The method in accordance with claim 7 in which the confinement layers are each of a material having an index of refraction smaller than that of the material of the active layer.

9. The method in accordance with claim 8 in which the substrate and first confinement layer are of indium phosphide of one conductivity type, the active layer is of indium gallium arsenide phosphide, the second confinement layer is of indium phosphide of the opposite conductivity type, the capping layer is of indium gallium arsenide phosphide of either conductivity type and a contact layer is of indium gallium arsenide phosphide of the opposite conductivity type.

* * * * *

UNITED STATES PATENT AND TRADEMARK OFFICE
CERTIFICATE OF CORRECTION

PATENT NO. : 4,355,396

DATED : October 19, 1982

INVENTOR(S) : Frank Zygmunt Hawrylo et al.

It is certified that error appears in the above-identified patent and that said Letters Patent is hereby corrected as shown below:

Column 6, lines 39 and 40, delete "has been inserted".

Signed and Sealed this

Eleventh Day of January 1983

[SEAL]

Attest:

GERALD J. MOSSINGHOFF

Attesting Officer

Commissioner of Patents and Trademarks